United States Patent
Lee

(10) Patent No.: US 7,183,218 B2
(45) Date of Patent: Feb. 27, 2007

(54) METHODS FOR FABRICATING A SEMICONDUCTOR DEVICE WITH ETCH END POINT DETECTION

(75) Inventor: Date-Gun Lee, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 225 days.

(21) Appl. No.: 10/734,818

(22) Filed: Dec. 12, 2003

(65) Prior Publication Data

US 2004/0127055 A1 Jul. 1, 2004

(30) Foreign Application Priority Data

Dec. 18, 2002 (KR) .................... 10-2002-0081371

(51) Int. Cl.
*H01L 21/00* (2006.01)

(52) U.S. Cl. ..................................... 438/703
(58) Field of Classification Search ................ 438/703
See application file for complete search history.

(56) References Cited

U.S. PATENT DOCUMENTS

| | | | |
|---|---|---|---|
| 4,376,672 A * | 3/1983 | Wang et al. | ................ 438/713 |
| 5,612,254 A | 3/1997 | Mu et al. | |
| 6,040,619 A | 3/2000 | Wang et al. | |
| 6,063,711 A | 5/2000 | Chao et al. | |
| 6,245,633 B1 | 6/2001 | Zhao et al. | |
| 6,383,943 B1 | 5/2002 | Chen et al. | |

* cited by examiner

*Primary Examiner*—Evan Pert
(74) *Attorney, Agent, or Firm*—Andrew D. Fortney

(57) ABSTRACT

The present invention relates to a fabrication method of a semiconductor device using EPD system, which enables uniform hole etching regardless of changes of etch rates of etching chemical and thickness of interlayer insulating layer after CMP, and the fabrication method comprises: forming a nitride layer on an interlayer insulating layer; forming a photoresist layer on the nitride layer, and exposing and developing the photoresist layer to form a photoresist pattern; etching the nitride layer using the photoresist pattern as a mask and contiguously etching the photoresist pattern and the interlayer insulating layer together; setting etch stop point as the point that the photoresist pattern is removed by etching and thus the nitride layer is exposed.

11 Claims, 2 Drawing Sheets

FIG. 1A (Background)
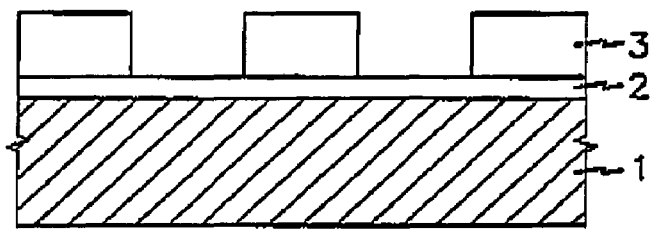
FIG. 1B (Background)
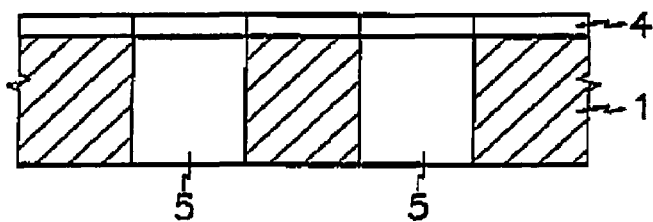
FIG. 2A
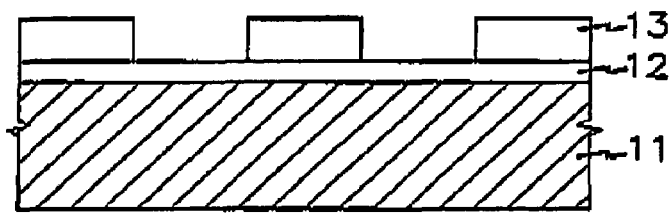
FIG. 2B
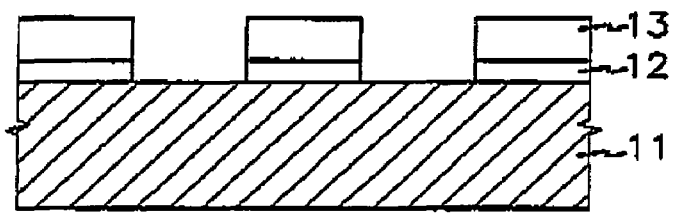

METHODS FOR FABRICATING A SEMICONDUCTOR DEVICE WITH ETCH END POINT DETECTION

FIELD OF THE DISCLOSURE

This disclosure relates generally to semiconductor devices, and more particularly to methods for fabricating a semiconductor device using end point detection during a hole etching process.

BACKGROUND

When two or more layers are deposited and the upper layer is to be etched during the fabrication of a semiconductor device, an end point detection (EPD) system is generally used in the etching process. The EPD system sets an etch stop point (e.g., the point at which the lower layer is exposed when etching the upper layer).

However, it is difficult to determine the etch stop point using the lower layer by the current EPD system for hole etching process, (which is used for forming contact holes or via holes), because the area exposed by via holes is small, (e.g., under 5% of the whole wafer area). Therefore, conventional time etching is used instead.

FIGS. 1a and 1b are sectional views illustrating a conventional hole etching process for a semiconductor device. As shown in FIG. 1a, an interlayer insulating layer 1, in which holes will be formed, is first formed. A nitride layer 2, which will be used as a hard mask, is formed on the interlayer insulating layer 1. A photoresist pattern 3 is formed on the nitride layer 2. The nitride layer 2 is etched using the photoresist pattern 3 as a mask to form a nitride layer pattern 4 as shown in FIG. 1b.

Subsequently, the interlayer insulating layer 1 is time-etched using the nitride pattern 4 as a mask to form holes 5. The etching time, which is set for the hole formation, is determined by considering the etch rate of the interlayer insulating layer 1.

However, the time-etching is based on a premise that the conditions or state in a chamber are always the same. Therefore, there is a problem that the interlayer insulating layer cannot be etched to a desired extent if there is a change in the etch rate of the etching chemical or if there is a change in the thickness of the interlayer insulating layer after the CMP.

Prior art references dealing with the subject matter of the etch stop layer include the following U.S. patents.

U.S. Pat. No. 6,383,943 describes a method of resolving a problem of discontinuous deposition of an adhesive layer at the bottom of via holes due to a notch of the silicon nitride etch stopper. U.S. Pat. No. 6,040,619 describes a formation method for a tungsten Damascene interconnect of a device using silicon nitride having a large amount of silicon as an etch stopper. U.S. Pat. No. 6,063,711 describes a method of forming a thin etch stop layer including oxynitride having large etching selectivity to oxide layer and preventing the etch stop layer from cracking. U.S. Pat. No. 6,245,663 describes a method of forming a thin etch stop layer by forming a dielectric etch stop layer after a metal CMP process instead of before the metal CMP process to prevent the etch stop layer being trimmed during the CMP. U.S. Pat. No. 5,612,254 describes a method of forming an interconnection inside the prepatterned channel in a semiconductor device.

BRIEF DESCRIPTION OF THE DRAWINGS

FIGS. 1a and 1b are cross-sectional views illustrating a prior art hole etching process of a semiconductor device.

FIGS. 2a–2e are cross-sectional views illustrating a hole etching process of a semiconductor device performed in accordance with the teachings of this disclosure.

Figure 2C:
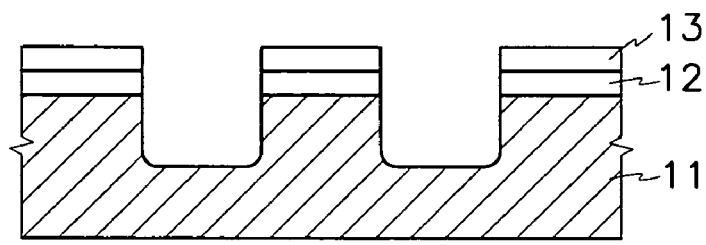

In the drawings, the thickness of layers and regions are exaggerated for clarity.

DETAILED DESCRIPTION

FIGS. 2a–2e are cross-sectional views illustrating a hole etching process of a semiconductor device performed in accordance with the teachings of this disclosure. As shown in FIG. 2a, a nitride layer 12 is first formed on an interlayer insulating layer 11 in which contact holes or via holes will be formed. The nitride layer 12 serves as a hard mask during a subsequent hole etching process. It is preferable that the thickness of the nitride layer 12 is about 200–800 Å, for example, about 500 Å.

Then, a photoresist layer is formed on the nitride layer 12. The photoresist layer is exposed and developed to form a photoresist pattern 13. The photoresist pattern 13 will be etched together with the interlayer insulating layer 11 during a subsequent process. Therefore, the thickness of the photoresist pattern 13 is determined by considering the thickness and etch rate of the interlayer insulating layer 11 and the etch rate of the photoresist pattern 13.

Next, as shown in FIG. 2b, the nitride layer 12 is etched using the photoresist pattern 13 as a mask. The photoresist pattern 13 is not removed, but remains after etching the nitride layer 12. Subsequently, the interlayer insulating layer 11 is etched using the photoresist pattern 13 as a mask as shown in FIG. 2c.

Figure 2D:
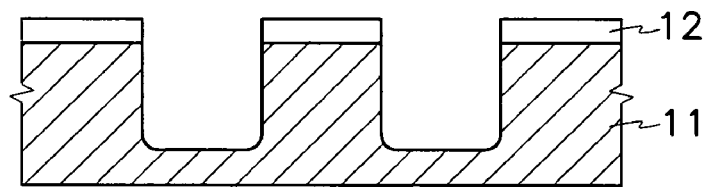

As described above, the photoresist pattern 13 is etched together with the interlayer insulating layer 11 during an interlayer insulating layer etching process. This etching process is terminated by setting the time point when the photoresist pattern 13 is entirely removed such that the nitride layer 12 is exposed by the etching process as an etch stop point, as shown in FIG. 2d.

As stated above, the photoresist pattern 13 is not removed when the nitride layer 12 is etched, but rather remains after etching the nitride layer 12. Further, the etch rate of the interlayer insulating layer 11 is larger than that of the photoresist pattern 13. When the etch rate of the interlayer insulating layer 11 is about 5000 Å/min and that of the photoresist pattern 13 is about 1800 Å/min, the interlayer insulating layer 11 is formed to have about 7500 Å thickness and the photoresist pattern 13 after etching the nitride layer is formed to have about 2500 Å thickness. As a result, the photoresist pattern 13 is entirely removed when the interlayer insulating layer 11 is etched about 7000 Å, thereby exposing the nitride layer 12.

Therefore, the EPD system is applicable in hole etching process by setting the exposing point of the nitride layer 12 as the etch stop point. If the EPD system is applied, it is preferable that the thickness of the photoresist pattern 13 is about 2500–3500 Å.

If it is desired to set the etch stop point as the point at which the interlayer insulating layer 11 is etched about 90%, the thickness of the photoresist pattern 13 should be smaller than the pre-determined value. On the other hand, if it is desired to set the etch stop point as the point at which the interlayer insulating layer 11 is completely etched, the thickness of the photoresist pattern 13 should be larger than the pre-determined value.

Figure 2E:
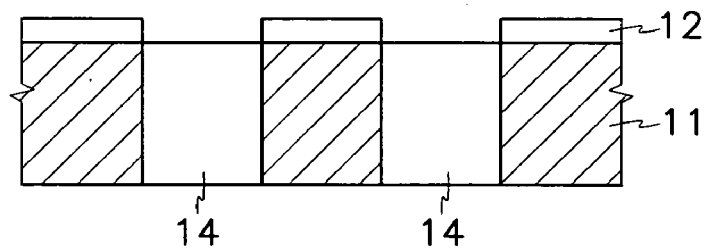

Subsequently, as shown in FIG. 2e, the interlayer insulating layer 11 is over-etched using the nitride layer 12 as a mask. Then, holes 14, (which may be used as contact holes or via holes), are completed in the interlayer insulating layer 11.

As described above, since an EPD system is applied to the hole etching process, the hole etching process can be performed to a uniform extent by the EPD system even if etching chemicals having different etch rates are used or if the thickness of the interlayer insulating layer 11 is changed after the CMP. In addition, various hole etching depths might be performed because the etch stop point is set at a desired point by controlling the thickness of the photoresist pattern.

From the foregoing, persons of ordinary skill in the art will appreciate that uniform hole etching can be performed regardless of etch rate changes of etching chemicals or thickness changes of the interlayer insulating layer after a CMP.

From the foregoing, persons of ordinary skill in the art will further appreciate that fabrication methods using an EPD system in an etching process have been disclosed. These methods enable uniform hole etching regardless of changes in the etch rates of the etching chemicals and/or the thickness of the interlayer insulating layer after CMP.

The illustrated fabrication method comprises: forming a nitride layer on an interlayer insulating layer; forming a photoresist layer on the nitride layer; exposing and developing the photoresist layer to form a photoresist pattern; etching the nitride layer using the photoresist pattern as a mask and contiguously etching the photoresist pattern and the interlayer insulating layer together; setting the etch stop point as the point that the photoresist pattern is removed by etching and, thus, the point at which the nitride layer is exposed.

After exposing the nitride layer by removing the photoresist pattern, the interlayer insulating layer may be over-etched using the nitride layer as a mask It is preferable that thickness of the nitride layer is about 200–800 Å, and that the thickness of the photoresist pattern is about 2500–3500 Å.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method to fabricate a semiconductor device comprising:
    forming a nitride layer on an interlayer insulating layer;
    forming a photoresist layer on the nitride layer;
    forming a photoresist pattern from the photoresist layer, the photoresist pattern having a thickness that depends on a thickness and an etch rate of the interlayer insulating layer and an etch rate of the photoresist pattern;
    etching the nitride layer using the photoresist pattern as a mask;
    etching the interlayer insulating layer together with the photoresist pattern; and
    setting an etch stop point as a point at which the photoresist pattern is removed by etching.

2. A method as defined in claim 1, wherein the nitride layer has a thickness of approximately 200–800 Å.

3. A method as defined in claim 1, wherein the photoresist pattern has a thickness of approximately 2500–3500 Å.

4. A method as defined in claim 1, further comprising, after the photoresist pattern is removed, over-etching the interlayer insulating layer using the nitride layer as a mask.

5. A method to fabricate a semiconductor device comprising:
    forming a first mask layer on an etch target layer;
    forming a second mask layer on the first mask layer;
    forming a first mask pattern by selectively etching the second mask layer, the first mask pattern having a thickness that depends on a thickness and an etch rate of the etch target layer and an etch rate of the first mask pattern;
    forming a second mask pattern by etching to first mask layer using the first mask pattern as a mask;
    etching the etch target layer together with the first mask pattern, wherein the first mask pattern is etched using the second mask pattern as a mask; and
    setting an etch stop point as a point at which the first mask pattern is removed by etching.

6. A method as defined in claim 5, wherein the first mask layer and the etch target layer have a same etch rate.

7. A method as defined in claim 5, wherein the first mask layer and the etch target layer have a different etch rate.

8. A method as defined in claim 6, wherein a thickness or the first mask layer is further determined by a desired etch depth in the etch target layer.

9. A method as defined in claim 8, wherein the first mask layer comprises a same material as the etch target layer.

10. A method to fabricate a semiconductor device comprising:
    forming a nitride layer on an interlayer insulating layer;
    forming a photoresist layer on the nitride layer;
    forming a photoresist pattern from the photoresist layer, the photoresist pattern having a thickness that depends on a thickness and an etch rate of the interlayer insulating layer and an etch rate of photoresist pattern;
    etching the nitride layer using the photoresist pattern as a mask;
    etching the interlayer insulating layer together with the photoresist pattern; and
    setting an etch stop point as a point at which the nitride layer is exposed.

11. A method to fabricate a semiconductor device comprising:
    forming a first mask layer on an etch target layer;
    forming a second mask layer on the first mask layer;
    forming a first mask pattern by selectively etching the second mask layer, the first mask pattern having a thickness that depends on a thickness and an etch rate of the etch target layer and an etch rate of first mask pattern;
    forming a second mask pattern by etching to first mask layer using the first mask pattern as a mask;
    etching the etch target layer together with the first mask pattern, wherein the first mask pattern is etched using the second mask pattern as a mask; and
    setting an etch stop point as a point at which the second mask pattern is exposed.

* * * * *